United States Patent [19]

Kanai et al.

[11] Patent Number: 4,866,303
[45] Date of Patent: Sep. 12, 1989

[54] ECL GATE ARRAY WITH COLLECTOR RESISTANCE COMPENSATION FOR DISTANCE FROM POWER SUPPLY PAD

[75] Inventors: Yasunori Kanai, Inagi; Kazumasa Nawata; Mitsuhisa Shimizu, both of Kawasaki, all of Japan

[73] Assignee: Fujitsu Limited, Kawasaki, Japan

[21] Appl. No.: 676,836

[22] Filed: Nov. 30, 1984

[30] Foreign Application Priority Data

Nov. 30, 1983 [JP] Japan ............................. 58-225629
Dec. 16, 1983 [JP] Japan ............................. 58-238556
Dec. 16, 1983 [JP] Japan ............................. 58-238555

[51] Int. Cl.$^4$ ............................................. H03K 19/86
[52] U.S. Cl. ................................... 307/443; 307/455; 307/264; 307/296 R
[58] Field of Search ............... 307/443, 455, 465–467, 307/264, 297, 296 R

[56] References Cited

U.S. PATENT DOCUMENTS

| | | | |
|---|---|---|---|
| 3,700,915 | 10/1972 | Marley ........................ | 307/296 R X |
| 4,311,925 | 1/1982 | Chang et al. .................. | 307/455 |
| 4,346,343 | 8/1982 | Berndlmaier et al. ......... | 307/296 R X |
| 4,435,654 | 3/1984 | Koide ............................ | 307/455 |

FOREIGN PATENT DOCUMENTS 0152229 9/1982 Japan ............................. 307/455
2110029A 11/1982 United Kingdom .

OTHER PUBLICATIONS

M. Suzuki et al., "A 5K-Gate Bipolar Masterslice LSI with a 500 PS Loaded Gate Display," Oct. 1983, vol. SC-18, No. 5, pp. 585-592, *IEEE Journal of Solid-State Circuits*, New York.

H. D. Varadarajan, "Programmable Swing Current Switch for Low-Power High-Speed Circuits," Mar. 1977, vol. 19, No. 10, pp. 3736-3737, *IBM Technical Disclosure Bulletin*, New York.

T. Goodman, "F300 Advanced Gate Array Offering Power/Delay Tradeoffs," Apr. 1980-May 13-15, 1980, vol. 5, No. 22/1, Figures 1, 3; p. 4-right-hand column, line 22, *Electro/80 Conference Record*, Boston, Ma.

H. Mukai et al., "Master Slice", Sep./Oct. 1978, vol. 26, No. 9/10, pp. 1325-1338, *Review of the Electrical Communication Laboratories*, Tokyo, Japan.

Hiromichi Kimura, "Semiconductor Integrated Circuit Device," Jan. 1984, vol. 8, No. 8, *Patents Abstracts of Japan*.

Masahiro Ueda, "Transistor Logic Circuit," Mar. 1981, vol. 5, No. 44, *Patents Abstracts of Japan*.

Nobuo Kunimi, "Logic Circuit," Jun. 1977, vol. 1, No. 58, *Patents Abstracts of Japan*.

Primary Examiner—David Hudspeth
Attorney, Agent, or Firm—Staas & Halsey

[57] ABSTRACT

An ECL gate array comprising a plurality of basic cells. Each basic cell has a pair of emitter-coupled transistors, and a load connected between the collectors of the transistors and a power supply line. In accordance with a circuit design information, the resistance value of the load can be selected for increasing a noise margin of the output logic levels without deteriorating the switching speed.

18 Claims, 8 Drawing Sheets

ECL GATE ARRAY WITH COLLECTOR RESISTANCE COMPENSATION FOR DISTANCE FROM POWER SUPPLY PAD

BACKGROUND OF THE INVENTION

(1) Field of the Invention

The present invention relates to an emitter-coupled logic (ECL) gate array, and more particularly, to an ECL gate array in which each basic cell has an improved noise margin without changing a logic swing.

(2) Description of the Related Art

Various approaches have been made toward improving the performance of an ECL gate array by improving its noise margin or switching speed, but these approaches have not resolved all of the problems to be found in ECL gate arrays.

In a conventional ECL gate array, resistors for determining the logical levels, i.e., a high logic level and a low logic level of each basic cell, have fixed resistance values, which causes a problem of deteriorated noise margin in some basic cells in an ECL gate array. For example, when a basic cell is arranged too distant from a power supply pad, the power supply voltage applied to the basic cell drops because of the length of the power supply line. Therefore, both the high logic level and the low logic level of such a basic cell are lowered, and such a lowered high logic level may be errouneously detected by the next stage basic cell as a normal low logic level.

Further, when a basic cell has two output transistors connected in parallel, to shorten the rising time of the voltage at its output end, the levels of the output high and low logic levels are raised, as later described in more detail with reference to the drawings, and the thus raised low logic level may be erroneously detected by the next stage basic cell as a high logic level.

Still further, when a basic cell has two output resistors connected in parallel, to shorten the falling time of the voltage at its output end, the levels of the output high and low logic levels are lowered, as later described in more detail, and the thus lowered high logic level may be erroneously detected by the next stage basic cell as a low logic level.

Furthermore, when an ECL gate array includes a sequential circuit, the output levels of its previous stage basic cells should have a particularly improved noise margin since the internal state of a sequential circuit depends on the immediately preceding input values. Therefore, it is necessary to change the output logic levels of the above-mentioned previous stage basic cells. However, in the conventional ECL gate array, it is impossible to change the output logic levels of only the above-mentioned previous stage basic cells without changing the output logic levels of remaining basic cells.

Generally, when performing a high switching operation, the logic swing between the low logic level and the high logic level is more and more decreased, and thus the above mentioned erroneous detection becomes more serious.

In another conventional ECL gate array (as disclosed in Japanese Unexamined Patent Publication (Kokai) No. 53-60554, laid opened on May 31, 1978, filed by Inventors: Yutaka Hara et al and Applicant: Hitachi Ltd), a basic cell capable of switching between a large logic swing and a small logic swing is disclosed. However, this conventional basic cell has a disadvantage of a low switching speed due to parasitic capacitances, as later described in more detail with reference to a drawing.

SUMMARY OF THE INVENTION

Accordingly, an object of the present invention is to provide an improved ECL gate array in which each basic cell can provide desired output logic levels in accordance with a desired design information of the basic cell, without decreasing or increasing the logic swing of the output logic levels.

To attain the above object, there is provided, according to the present invention, an ECL gate array comprising a plurality of basic cells arranged in a matrix. Each of the basic cells comprises at least a pair of transistors and a load provided between the pair of transistors and a power supply line. The pair of transistors are emitter-coupled. In the basic cells and between the basic cells, wirings are provided to form a desired IC in accordance with a desired design information. The load comprises a first load resistor and a second load resistor, each having one end, respectively, connected to the collectors of the pair of transistors, a common connecting terminal commonly connected to the other ends of the first load resistor and the second load resistor, and a plurality of common collector resistors. A desired number of the common collector resistors are connected to each other to form a common collector load connected between the power supply line and the common connecting terminal. The resistance value of the common collector load can be varied by varing the desired number in accordance with the desired design information.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the prior arts and the problems therein will be first described with reference to FIGS. 1 through 4.

Figure 1:
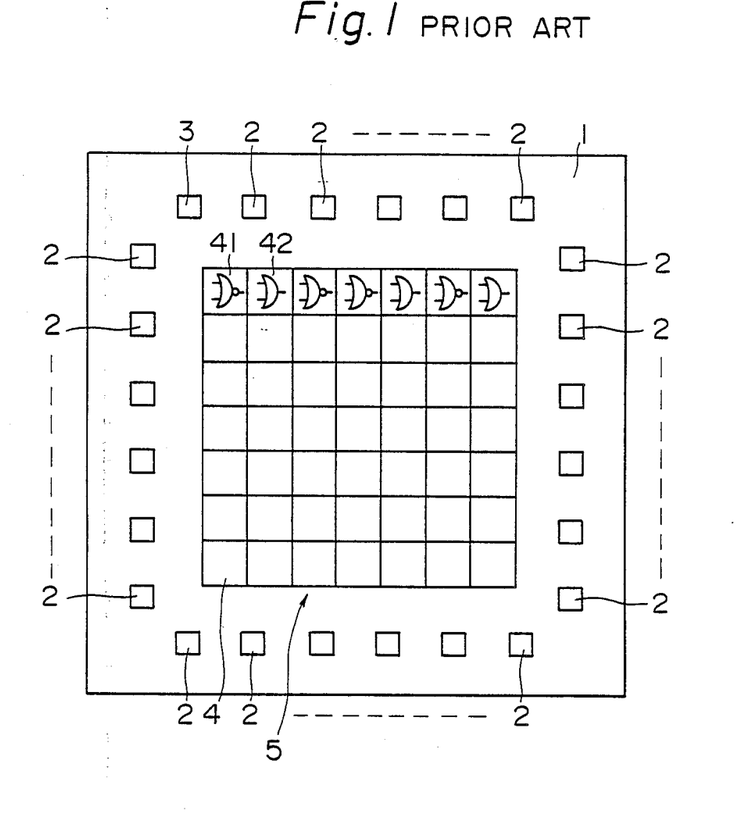
FIG. 1 is a general plan view of a conventional ECL gate array explaining the background of the invention.

FIG. 1 is a general plan view of a conventional ECL gate array. In FIG. 1, a number of input/output pads 2 and a power supply pad 3 are arranged on the periphery of a semiconductor chip 1, and a plurality of basic cells 4 are arranged in a matrix 5 on the central portion of the semiconductor chip 1. Each of these basic cells is an ECL gate functioning, for example, as a NOR gate 41 or as an OR gate 42. The present invention relates to an improvement of each basic cell 4.

Figure 2:
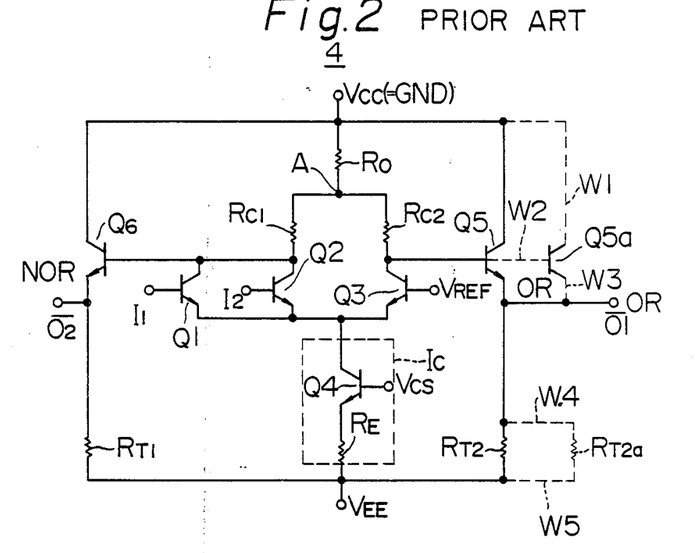
FIG. 2 is a circuit diagram illustrating a conventional basic cell in an ECL gate array.

FIG. 2 is a circuit diagram illustrating one of the conventional basic cells 4 shown in FIG. 1. In FIG. 2, the conventional basic cell 4 includes input transistors Q1 and Q2 for receiving input signals $I_1$ and $I_2$ at their bases, a reference transistor Q3 for receiving a reference voltage $V_{REF}$ at its base, a constant current source $I_C$ consisting of a transistor Q4 and a resistor $R_E$, a first output transistor Q5, and a second output transistor Q6. The input transistors Q1 and Q2 and the reference transistor Q3 are emitter-coupled. A first load resistor $R_{C1}$ is connected between the collectors of the input transistors Q1 and Q2 and a common connecting point A. A second load resistor $R_{C2}$ is connected between the collector of the reference transistor Q3 and the common connecting point A. A common load resistor $R_0$ is connected between the common connecting point A and a ground voltage power supply line $V_{CC}$. $R_{T1}$ and $R_{T2}$ are output resistors.

By the basic cell shown in FIG. 2, a logical OR is obtained at a first output end $\bar{O}_1$, and a logical NOR is obtained at a second output end $\bar{O}_2$. The logic swing between a high logic level and a low logic level at the output end $\bar{O}_1$ or $\bar{O}_2$ is fixed for all of the basic cells because the resistors $R_0$, $R_{C1}$, $R_{C2}$, and $R_E$, respectively, have predetermined fixed resistances, and the voltages $V_{REF}$ and $V_{CS}$ are also predetermined fixed voltages.

Since the logic swing is fixed, there are problems in the conventional basic cell. For example, when the basic cell is arranged remote from the power supply pad 3 (see FIG. 1), a voltage drop through the power supply line $V_{CC}$ or through a negative-voltage power supply line $V_{EE}$ becomes very large. Therefore, the high logic level and the low logic level at the output end $\bar{O}_1$ or $\bar{O}_2$ are lowered in comparison with a normal high logic level. The lowered high logic level may be erroneously detected by the next stage basic cell as a low logic level. Accordingly, the noise margin of the basic cell is decreased in this case, especially for the high logic level.

Figure 3:
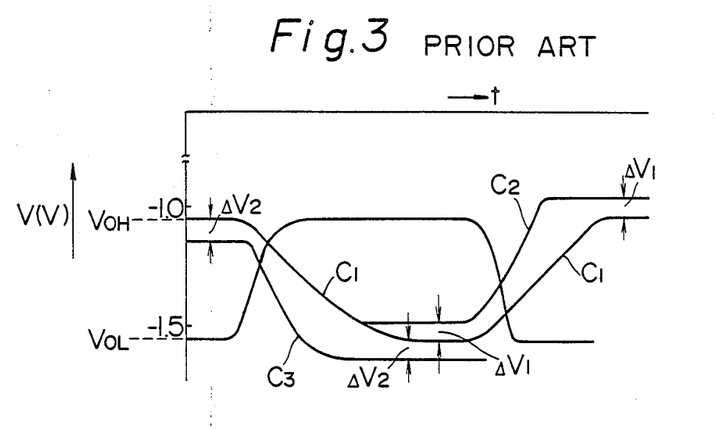
FIG. 3 is a waveform diagram explaining the operation of the basic cell shown in FIG. 2.

In another example, two output transistors are often connected in parallel to shorten the rising time of the logic level at the output end. In FIG. 2, dash lines W1, W2, and W3 show the additional wirings for connecting an additional output transistor Q5a. In this case, since the two output transistors Q5 and Q5a drive a load (not shown) connected to the output end $\bar{O}_1$, the driving capability is increased or the burden of the each output transistor Q5 or Q5a is decreased in comparison with the case where a single output transistor is employed. Thus, the rising time is shortened, as shown in FIG. 3, by a curve C2 in comparison with a curve C1; where the curve C2 represents the output waveform when the two output transistors Q5 and Q5a are connected, and the curve C1 represents the output waveform when only the single output transistor Q5 is employed.

However, when the two output transistors are employed, the emitter current of each output transistor is decreased in comparison with the case when the single output transistor is employed. Therefore, the base-emitter voltage is decreased, and accordingly, both the high logic level and the low logic level at the output end $\bar{O}_1$ are increased by $\Delta V_1$, as shown in FIG. 3. When the logic swing at the output end $\bar{O}_1$ is designed to be 500 mV, the increased value $\Delta V_1$ reaches the range of about 30 mV through 40 mV. The thus increased low logic level $V_{O1} + \Delta V_l$ may be erroneously detected as a high logic level by the next stage basic cell.

In still another example two output resistors are often connected in parallel to shorten the falling time of the logic level at the output end. In FIG. 2, dash lines W4 and W5 show the additional wirings for connecting an additional output resistor $R_{T2a}$. Assuming that the additional output transistor Q5a is not connected to the basic cell 4, then in this case, since the emitter current of the transistor Q5 is increased in comparison with the case where the additional resistor $R_{T2a}$ is not connected, the base-emitter voltage and the base current of the output transistor Q5 are also increased. Accordingly, both the high logic level and the low logic level at the output end $\bar{O}_1$ are decreased by $\Delta V_2$, as shown in FIG. 3. When the logic swing at the output end $\bar{O}_1$ is designed to be 500 mV, the decreased value $\Delta V_2$ is also in the range of about 30 mV through 40 mV. Thus, the decreased high logic level $V_{OH} - \Delta V_2$ also may be erroneously detected as a low logic level by the next stage basic cell.

The above-mentioned shift of the logic swing causes a decrease of the noise margin, especially when the logic swing is decreased to increase the switching speed. This noise margin is particularly important when the next stage of the basic cell is a sequential circuit.

In the above-mentioned conventional basic cell, the logic swing is fixed.

Figure 4:
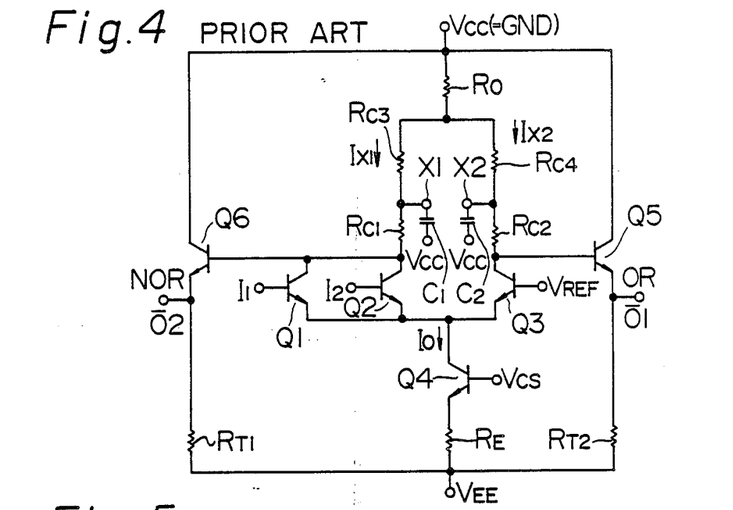
FIG. 4 is a circuit diagram illustrating another conventional basic cell in an ECL gate array.

FIG. 4 shows an another example of a conventional basic cell in which the logic swing can be changed without changing the threshold level. In FIG. 4, when terminals X1 and X2 are short-circuited, a small logic swing is obtained, and when the terminals X1 and X2 are not connected, a large logic swing is obtained. In the small logic swing and the large logic swing, the threshold voltage is constant but the noise margin is naturally increased by the large logic swing.

There is, however, a disadvantage in the basic cell shown in FIG. 4. That is, the terminals X1 and X2 are positioned in current paths including resistors $R_{C3}$ and $R_{C1}$, and resistors $R_{C4}$ and $R_{C2}$, respectively. The currents $I_{X1}$ and $I_{X2}$ flowing through the current paths are changed in response to the switching operation of the basic cell. For example, when the input transistor Q1 or Q2 is in an ON stage, and when the reference transistor Q3 is in an OFF stage, the current $I_{X1}$ flowing through the resistors $R_{C3}$ and $R_{C1}$ is large, and the current flowing through the resistors $R_{C4}$ and $R_{C1}$ is small.

From this state, when the input transistors Q1 and Q2 are turned off, and when the reference transistor Q3 is turned on, the current $I_{X1}$ is decreased to be small and the current $I_{X2}$ is increased to be large. Accordingly, the currents $I_{X1}$ and $I_{X2}$ at the terminals $X_1$ and $X_2$ are always changed in response to the switching operation. Thus the parasitic capacitors C1 and C2, naturally present between the terminals $X_1$ and $X_2$ and the power supply line $V_{CC}$, always effect a charge and discharge operation in response to the switching operation of the basic cell. This charge and discharge operation reduces the switching speed of the basic cell.

The preferred embodiments of the present invention are described in the following.

Figure 5:
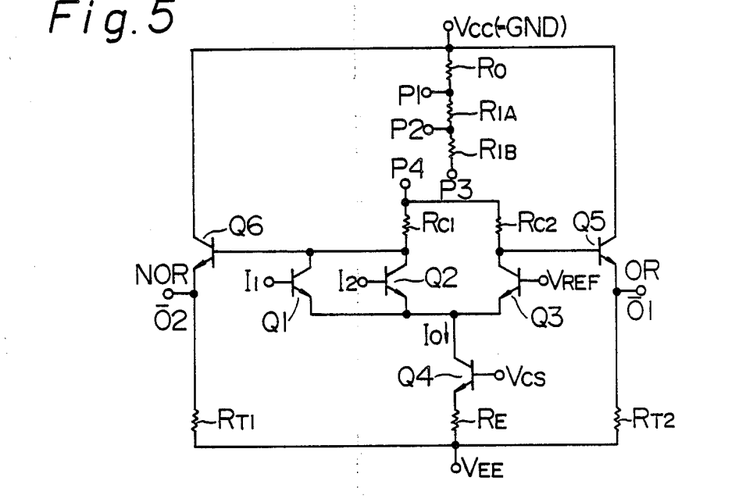
FIG. 5 is a circuit diagram illustrating a basic cell in an ECL gate array before determining a common collector load according to an embodiment of the present invention.

FIG. 5 shows a basic cell according to an embodiment of the present invention. In FIG. 5, and in the other drawings, the same reference symbols are provided to the same parts or portions as those in the conventional circuits shown in FIGS. 2 and 4. The main feature in the circuit shown in FIG. 5 resides in the provision of additional resistors $R_{1A}$ and $R_{1B}$, first, second, and third selecting terminals P1 through P3, and a common connecting terminal P4 in place of the common connecting terminal A in the conventional basic cell. The other portions are the same as those in the conventional basic cell shown in FIGS. 2 and 4.

The resistors $R_0$, $R_{1A}$, and $R_{1B}$, i.e., common collector resistors, are connected in series between the ground-voltage power supply line $V_{CC}$ and the third selecting terminal P3. The common collector resistors $R_0$, $R_{1A}$, and $R_{1B}$ are used to shift the voltage level at the collectors of the transistors Q1, Q2, and Q3. Therefore, the resistors $R_0$, $R_{1A}$, and $R_{1B}$ are referred to as level shifting resistors. The resistors $R_0$ and $R_{1A}$ constitute a standard resistor having a standard resistance value. The first selecting terminal P1 is connected to a common connecting point between the resistors $R_0$ and $R_{1A}$. The second selecting terminal P2 is connected to a common connecting point between the resistors $R_{1A}$ and $R_{1B}$. The third selecting terminal P3 is connected to the other end of the resistor $R_{1B}$. The resistance values of the additional resistors $R_{1A}$ and $R_{1B}$ are about $0.1 R_0$ through $0.2 R_0$, where $R_0$ represents the resistance of the resistor $R_0$ In accordance with a desired design information for forming a desired integrated circuit (IC) including the ECL gate array, the common connecting terminal P4 is connected to one of the selecting terminals P1 through P3. For example, in normal usage, the common connecting terminal P4 is connected to the second selecting terminal P2 in such a manner that the resistors $R_0$ and $R_{1A}$ constitute a common collector load. Where the noise margin of the high voltage level at the output end $\bar{0}_1$ or $\bar{0}_2$ may be increased, the common connecting terminal P4 is connected to the first selecting terminal P1 so that only the resistor $R_0$ constitutes a common collector load having a smaller resistance value than that formed in the normal usage by two resistors $R_0$ and $R_{1A}$. Where the noise margin of the low voltage level at the output end $\bar{0}_1$ or $\bar{0}_2$ may be increased, the common connecting terminal P4 is connected to the third selecting terminal P3 so that the three resistors $R_0$, $R_{1A}$, and $R_{1B}$ constitute a common collector register having a larger resistance value than that formed in the normal usage by the two resistors $R_0$ and $R_{1A}$.

In all of the above cases, assuming that the voltage at the common connecting terminal is $V_{P4}$, which varies depending on the connection to either one of the selecting terminals P1 through P3, then the high logic level $V_{OH}$ and the low logic level $V_{OL}$ at the output end $\bar{0}_1$ is expressed as:

$$V_{OH} = V_{P4} - V_{BEQ5} - I_{BQ5} \cdot R_{C2}$$

$$V_{OL} = V_{P4} - V_{BEQ5} - I_{BQ5} + \alpha_1 I_0)R_{C2}$$

where $V_{BEQ5}$ is the base-emitter voltage of the transistor Q5; $I_{BQ5}$ is the base current of the transistor Q5; $\alpha_1$ is a ratio between the collector current and the emitter current of the reference transistor Q3; and $R_{C2}$ is the resistance value of the second load resistor $R_{C2}$ For the output end $\bar{0}_2$, the high logic level and the low logic level also can be expressed by similar expressions, i.e., $$V_{OH} = V_{P4} - V_{BEQ6} - I_{BQ6} R_{C1}$$

$$V_{OL} = V_{P4} - V_{BEQ6} - (I_{BQ6} + \alpha_2 I_0)R_{C1}$$

The voltage $V_{P4}$ can be changed by selecting one of the selecting terminals P1 through P3 to be connected to the common connecting terminal P4.

Figure 6:
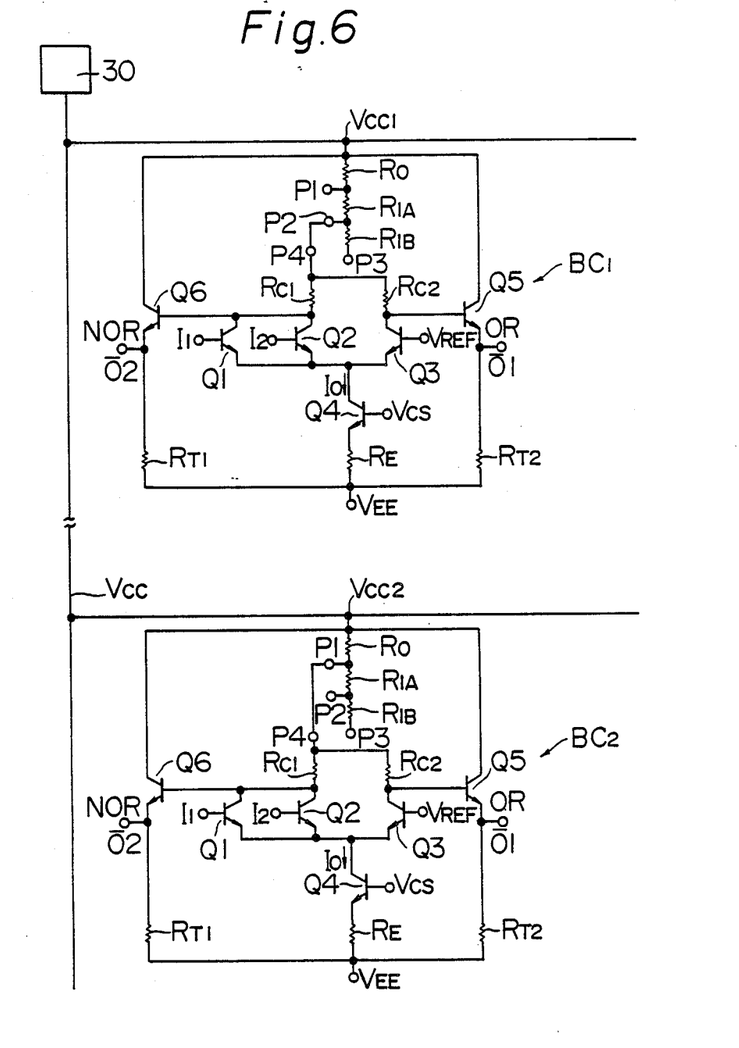
FIG. 6 is a circuit diagram illustrating two basic cells in an ECL gate array, explaining a wiring application in the basic cells according to another embodiment of the present invention.

FIG. 6 shows two basic cells in an ECL gate array according to an embodiment of the present invention. In FIG. 6, two basic cells $BC_1$ and $BC_2$ are shown. The first basic cell $BC_1$ is arranged at a position near a power supply pad 30 on a chip of the ECL gate array. The second basic cell $BC_2$, however, is arranged much farther from the power supply pad 30 than the first basic cell $BC_1$. Thus, because of the length of the power supply line $V_{CC}$ from the power supply pad 30 to the second basic cell $BC_2$, the voltage at a power supply end $V_{CC2}$ is considerably lowered from the power supply voltage applied to the power supply pad 30, due to a voltage drop through the power supply line between the power supply pad 30 and the power supply end $V_{CC2}$. Therefore, the high logic level and the low logic level at the output end $0_1$ of the second basic cell $BC_2$ are lower than those of the first basic cell $BC_1$.

To compensate for the lowered high logic level in the second basic cell $BC_2$, the first selecting terminal P1 is connected to the common connecting terminal P4. Whereas, in the first basic cell $BC_1$, the second selecting terminal P2 is connected to the common connecting terminal P4, because it is not necessary to raise or lower the output logic level from a standard level.

Figure 7:
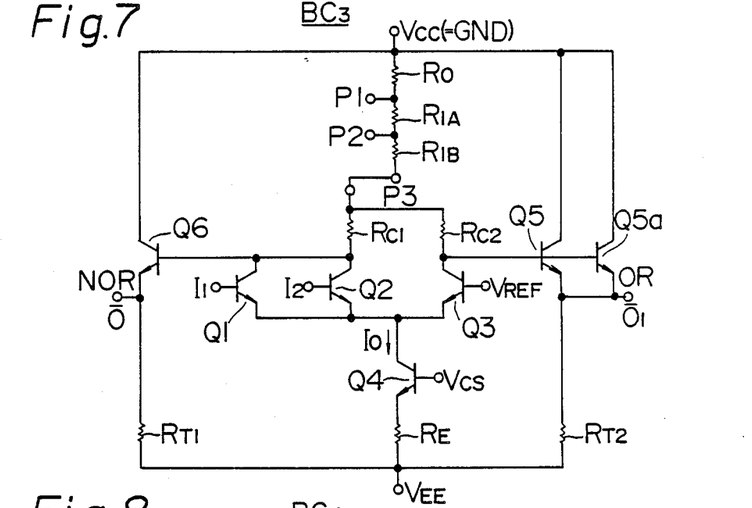
FIG. 7 is a circuit diagram illustrating a basic cell after determining a common collector load according to still another embodiment of the present invention.

FIG. 7 shows another basic cell according to still another embodiment of the present invention. In FIG. 7, two output transistors Q5 and Q5a are connected in parallel. As described before with reference to FIGS. 2 and 3, the provision of the additional transistors Q5a causes the raised output logic levels. Therefore, in order to compensate for the raised low logic level, the third selecting terminal P3 is connected to the common connecting terminal P4.

Figure 8:
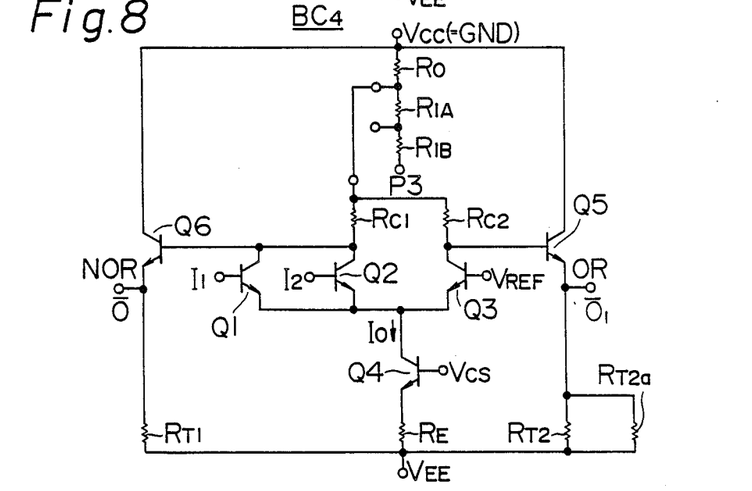
FIG. 8 is a circuit diagram illustrating a basic cell after determining a common collector load according to still another embodiment of the present invention.

FIG. 8 shows still another basic cell according to still another embodiment of the present invention. In FIG. 8, two output resistors $R_{T2}$ and $R_{T2a}$ are connected in parallel. As described above, the provision of the additional transistors $R_{T2a}$ causes the output logic levels to be lowered. Therefore, to compensate for the lowered high logic level, the first selecting terminal P1 is connected to the common connecting terminal P4.

Figure 9:
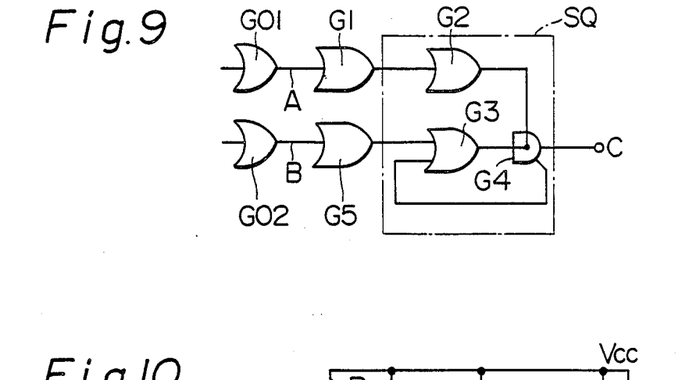
FIG. 9 is a logic circuit diagram including a sequential circuit in an ECL gate array, according to still another embodiment of the present invention.

FIG. 9 shows a logic circuit including a sequential circuit in an ECL gate array according to still another embodiment of the present invention. In FIG. 9, peripheral OR gates G01 and G02 are connected to input OR gates G1 and G5, respectively. The input OR gates G1 and G5 are connected to a sequential circuit SQ. The sequential circuit SQ includes OR gates G2 and G3, and an AND gate G4. The output of the OR gate G1 is connected to the input of the OR gate G2. The outputs of the OR gates G1 and G5 are connected to the inputs of the OR gates G2 and G3. The outputs of the OR gates G2 and G3 are connected to the inputs of the AND gate G4. The output of the AND gate G4 is connected to another input of the OR gate G3 and to an output end C. These gates G01, G02, and G1 through G5 are realized by the basic cells shown in FIG. 5. The truth table explaining the relationship between the inputs A and B applied to the OR gates G1 and G5 and the output C is as shown below:

| Truth Table | | |
|---|---|---|
| A | B | $C_{n+1}$ |
| H | H | H |
| H | L | Cn |
| L | H | L |
| L | L | L | where $C_{n+1}$ represents a current logic level of the output C, and Cn represents an immediately preceding logic level of the output C.

As will be seen from the above table, if the input B is changed to the low logic level from a state wherein both of the inputs A and B are at the high logic level H, so that the output C is also at the high logic level H, the output C is Cn which is the same as the immediately preceding output logic level, i.e., the high logic level H. However, if a noise is applied instantaneously so that the input A turns instantaneously to the low logic level L, the output C also turns to the low logic level. From this state, even after the noise is removed and the input A recovered to the high logic level H, the output C remains at the low logic level L. Therefore, the output C is erroneously turned from the high logic level H to the low logic level L even after the noise is removed. To recover the output C to the high logic level H, both inputs A and B should be turned to the high logic level H.

Similarly, where the input A is H, the input B is L, and the output C is L, when the input B turns instantaneously to H and again recovers to L, the output C level is changed from L to H even after the recovery of the input B.

Therefore, according to the embodiment of the present invention, the high logic level of the output of the input OR gate G1 is raised to increase the noise margin of the high logic level, and the low logic level of the output of the input OR gate G5 is lowered to increase the noise margin of the low logic level.

Figure 10:
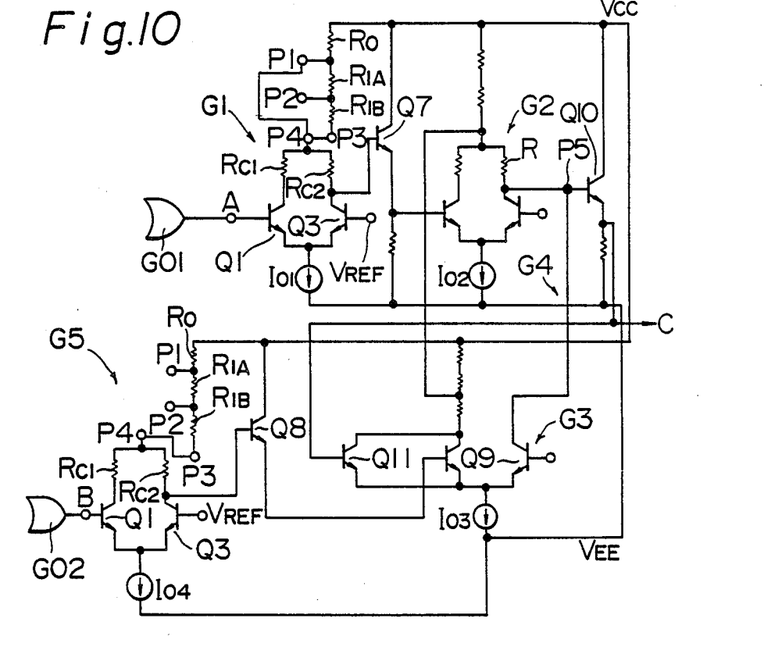
FIG. 10 is a circuit diagram illustrating the circuit shown in FIG. 9 in more detail.

FIG. 10 shows a detailed circuit diagram of the circuit shown in FIG. 9. In FIG. 10, the output high logic level of the input OR gate G1 is raised by connecting the first selecting terminal P1 to the common connecting terminal P4. Also, the output low logic level of the input OR gate G5 is lowered by connecting the third selecting terminal P3 to the common connecting terminal P4. An emitter follower transistor Q7 operates to send the output of the OR gate G1 to the input of the OR gate G2, and an emitter follower transistor Q8 operates to send the output of the OR gate G5 to the input of the OR gate G3. The AND gate G4 is realized by connecting the collector of a transistor Q9 in the OR gate G3 to the output point P5 of the OR gate G2. That is, the AND gate G4 is a collector dot AND gate. The emitter of a transistor Q10 is connected to the output end C and to the base of an input transistor Q11 in the OR gate G3. The constitutions of the OR gates G2 and G3 are well known and, therefore, are not described here. $I_{01}$, $I_{02}$, $I_{03}$, and $I_{05}$ are constant current sources of the OR gates G1, G2, G3, and G5, respectively.

In the foregoing embodiments, the resistors $R_0$, $R_{1A}$, and $R_{1B}$ are previously connected in series before selecting one of the selecting terminals to be connected to the terminal P4. The present invention, however, is not restricted to this arrangement.

In that, instead of connecting the resistors $R_0$, $R_{1A}$, and $R_{1B}$ in series, resistors $R_{00}$, $R_{1A0}$, and $R_{1B0}$ may be arranged without wiring in parallel before determining the circuit design.

Figure 11:
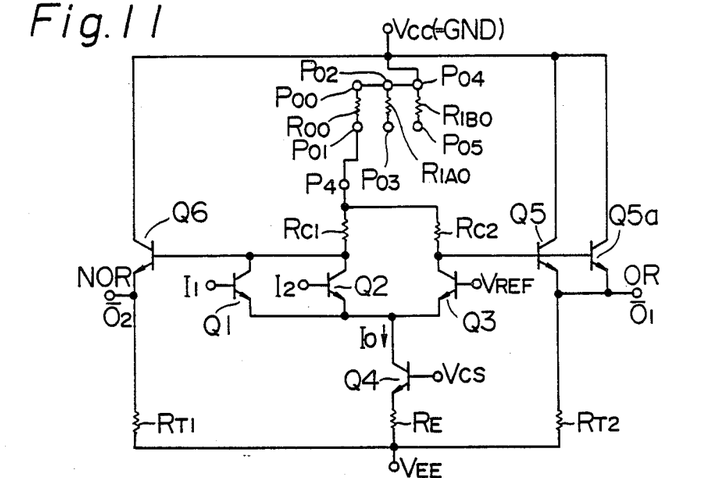
FIG. 11 is a circuit diagram illustrating a basic cell according to still another embodiment of the present invention.

FIG. 11 shows the resistors $R_{00}$, $R_{1A0}$, and $R_{1B0}$ in still another basic cell according to still another embodiment of the present invention. In FIG. 11, the resistors $R_{00}$, $R_{1A0}$, and $R_{1B0}$ are connected between terminals $P_{00}$ and $P_{01}$, $P_{02}$ and $P_{03}$, and $P_{04}$ and $P_{05}$, respectively. The terminals $P_{00}$, $P_{02}$, and $P_{04}$ are connected to the power supply line $V_{CC}$. The terminals $P_{01}$, $P_{03}$, and $P_{05}$ are the selecting terminals. Since the two output transistors Q5 and Q5a are connected in parallel, as in the embodiment shown in FIG. 7, the common collector load should have a higher resistance value. Therefore, the selecting terminals $P_{03}$ and $P_{05}$ are not connected to any terminal, and, only the selecting terminal $P_{01}$ is connected to the common connecting terminal P4. Thus, only the resistor $R_{00}$ is connected between the common connecting terminal P4 and the power supply line $V_{CC}$.

Figure 12:
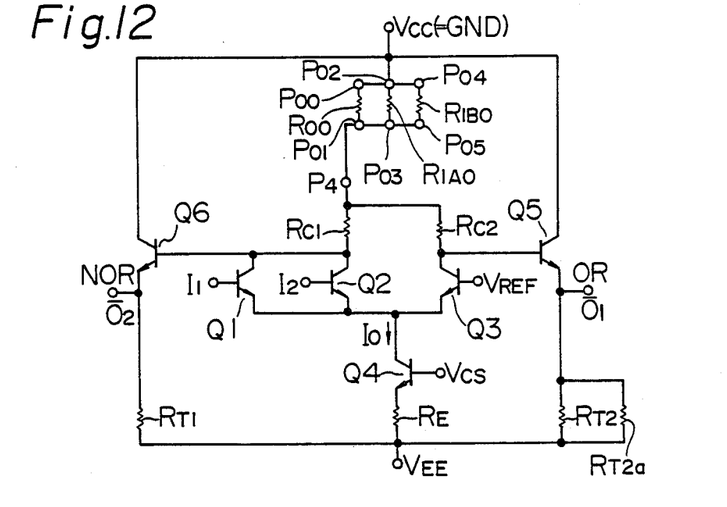
FIG. 12 is a circuit diagram illustrating a basic cell according to still another embodiment of the present invention.

FIG. 12 shows a still another application of the connection of the resistors $R_{00}$, $R_{1A0}$, and $R_{1B0}$ in a basic cell according to still another embodiment of the present invention. In FIG. 12, since the two output resistors $R_{T2}$ and $R_{T2a}$ are connected in parallel, as in the embodiment shown in FIG. 8, the common collector load should have a lower resistance value. Therefore, the selecting terminals $P_{00}$, $P_{02}$, and $P_{04}$ are connected to the power supply line $V_{CC}$, and the selecting terminals $P_{01}$, $P_{03}$, and $P_{05}$ are connected to the terminal P4, to realize the smallest common collector resistance, i.e., $R_{00} \cdot R_{1A0}(R_{1A0}A_{1B0} + R_{00}R_{1A0} + R_{00} \cdot R_{1B0})$, where $R_{00}$, $R_{1A0}$, and $R_{1B0}$ also represent the resistance values. In FIGS. 11 and 12, the resistance $R_{00}$ is smaller than the resistance $R_{1A0}$ or $R_{1B0}$.

Figure 13:
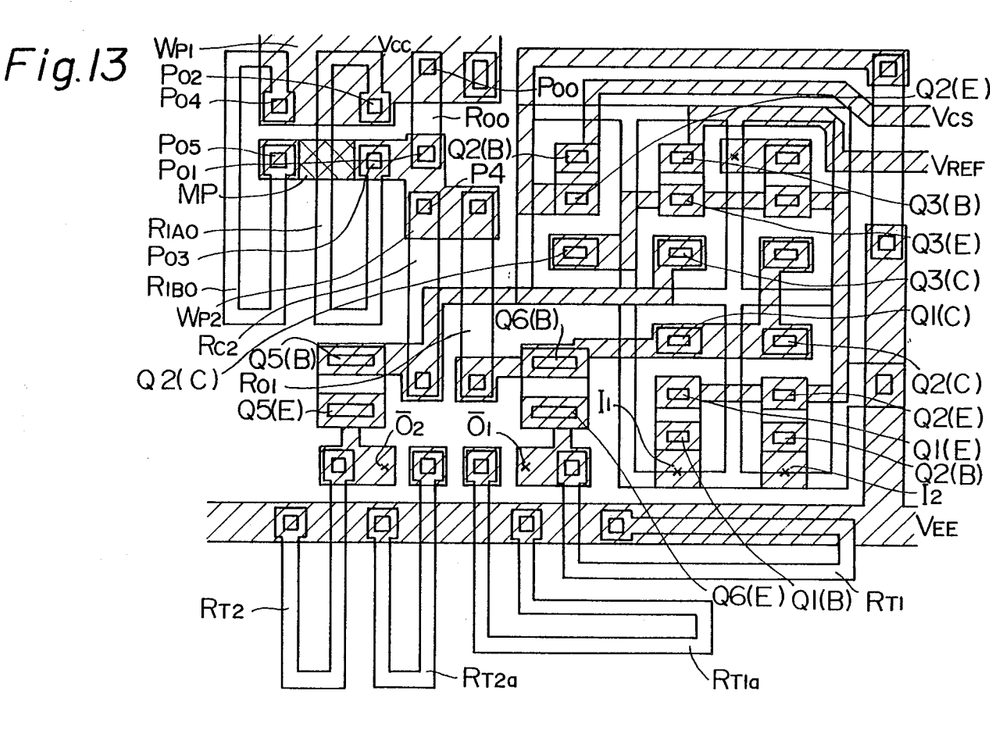
FIG. 13 is a plan view illustrating a wiring pattern in the basic cell shown in FIG. 12.

FIG. 13 is a plan view illustrating a wiring pattern in the basic cell shown in FIG. 12. In FIG. 13, the selecting terminals $P_{00}$, $P_{01}$, $P_{02}$, $P_{03}$, $P_{04}$, and $P_{05}$, and the common connecting terminal 4, are formed as contact windows. The resistances $R_{00}$, $R_{1A0}$, and $R_{1B0}$ are formed by a diffusion layer. The selecting terminals $P_{00}$, $P_{02}$, and $P_{04}$ are in contact with and covered by a wiring $W_{P1}$ for the power supply line $V_{CC}$. The selecting terminals $P_{01}$, $P_{03}$, and $P_{05}$, and the common connecting terminal P4, are in contact with and covered by another wiring $W_{P2}$. The wirings $W_{P1}$ and $W_{P2}$ are formed by a metal layer in accordance with a desired design information. That is, an appropriate mask for patterning the wirings is previously formed in accordance with the desired design information. For example, when the selecting terminal $P_{05}$ should not be connected, a mask pattern MP between the terminals $P_{03}$ and $P_{05}$, as illustrated by mesh in the figure, is removed so that no wiring is provided between them. In the figure, the slash line portions represent wirings formed by the metal layers. Reference symbols Q1(C), Q1(E), and Q1(B), respectively, represent the collector contact, the emitter contact, and the base contact of the input transistor Q1. Similar symbols are applied to the other transistors. Each symbol X in the figure represents a throughhole for connection to the upper or lower wiring layer. Therefore, the input ends $I_1$ and $I_2$, and the output ends $\bar{O}_1$ and $\bar{O}_2$, are connected by throughholes to the other wiring layer.

From the foregoing description, it will be apparent that, according to the present invention, each basic cell in an ECL gate array can output the desired logic levels in accordance with a desired circuit design information, without decreasing or increasing the logic swing of the output logic levels, and therefore, the noise margin is increased without deteriorating the switching speed of the basic cell.

The present invention is not restricted to the described embodiments. Various changes and modifications are possible without departing the scope of the invention. For example, the number of the common collector resistors may be two or more.

We claim:

1. An ECL gate array comprising:
   a plurality of basic cells including first and second basic cells each having an output and being arranged in a matrix, each of said first and second basic cells comprising
   at least a pair of emitter-coupled transistors,
   a load provided between said pair of transistors and a first power supply line, and
   current source means, provided between emitters of said pair of emitter coupled transistors and a second power supply line, for providing a substantially constant current;
   wirings formed in and between said first and second basic cells so as to form a desired IC in accordance with a desired design information;
   said load comprising;
   a first load resistor and a second load resistor each having one end respectively connected to the collectors of said pair of emitter-coupled transistors;
   a common connecting terminal commonly connected to the other ends of said first load resistor and said second load resistor; and
   a plurality of level shifting resistors, a desired number of said level shifting resistors being connected to each other to form a common collector load connected between said first power supply line and said common connecting terminal, the resistance value of said common collector load being variable by varying said desired number in accordance with said desired design information, said respective current source means for said first and second basic cells providing substantially the same current, and said respective common collector load for said first and second basic cells having different resistance values.

2. An ECL gate array as set forth in claim 1, further comprising a plurality of selecting terminals respectively connected to the ends of said level shifting resistors, said common connecting terminal being connected to at least one of said selecting terminals for forming said common collector load.

3. An ECL gate array as set forth in claim 2, wherein each of said basic cells further comprises an output transistor and an output end, said output transistor having a base connected to the collector of one of said pair of transistors, a collector connected to said power supply line, and an emitter connected to said output end, the voltage levels at said output end being adjusted to desired values by connecting said common connecting terminal to at least one of said selecting terminals in accordance with said voltage levels.

4. An ECL gate array as set forth in claim 3, wherein said basic cells are classified into a first group, second group, and third group, each of the basic cells in said first group operatively providing a standard voltage drop across said common collector load, each of the basic cells in said second group operatively providing, across said common collector load, a voltage drop larger than said standard voltage drop, and each of the basic cells in said third group operatively providing, across said common collector load, a voltage drop smaller than said standard voltage drop; and said desired design information including data for instructing which of said first, second, and third groups of basic cells should be formed.

5. An ECL gate array as set forth in claim 4, wherein said common collector resistors are connected in series, each of said selecting terminals being connected to one of the ends of said level shifting resistors, said common connecting terminal being connected to one of said selecting terminals.

6. An ECL gate array as set forth in claim 5, wherein, when said desired design information instructs the forming of said first group of basic cells, said common collector terminal in said first group is connected to a standard terminal of said selecting terminals so as to form said common collector load having a standard resistance value.

7. An ECL gate array as set forth in claim 6, wherein, said desired design information instructs the forming of said second group of basic cells, said common collector terminal in said second group is connected to a terminal nearer to said power supply line than said standard terminal of said selecting terminals so as to form said common collector load having a resistance value lower than said standard resistance value.

8. An ECL gate array as set forth in claim 6, wherein, when said desired design information instructs the forming of said third group of basic cells, said common collector terminal in said third group is connected to a terminal farther from said power supply line than said standard terminal of said selecting terminals so as to form said common collector load having a resistance value higher than said standard resistance value.

9. An ECL gate array as set forth in claim 7 further comprising a power supply pad connected to said power supply line, and said second group of basic cells comprising a basic cell arranged farther from said power supply pad than a basic cell in said first group.

10. An ECL gate array as set forth in claim 7, wherein said second group of basic cells comprises an improved basic cell having another output transistor connected in parallel to said output transistor, said another output transistor operatively functioning to improve the rising speed of the output voltage at said output end.

11. An ECL gate array as set forth in claim 8, wherein each of said basic cells having an output resistor connected between the emitter of said output transistor and an another power supply line, said third group of basic cells comprising an improved basic cell having another output resistor connected in parallel to said output resistor, said another output transistor operatively functioning to improve the falling speed of the output voltage at said output end.

12. An ECL gate array as set forth in claim 4, wherein said level shifting resistors are connected in parallel, said level shifting resistors comprising a standard resistor having a standard resistance value.

13. An ECL gate array as set forth in claim 12, wherein, when said desired design information instructs the forming of said first group of basic cells, said common collector terminal in said first group is connected to only a standard terminal of said standard resistor, the other end of said standard resistor being connected to said power supply line, whereby said common collector load has said standard resistance value.

14. An ECL gate array as set forth in claim 13, wherein, when said desired design information instructs the forming of said third group of basic cells, at least two of said level shifting resistors are connected in parallel between said common connecting terminal and said power supply line so as to form said common collector load having a resistance value lower than said standard resistance value.

15. An ECL gate array as set forth in claim 13, wherein, when said desired design information instructs the forming of said second group of basic cells, only one of said level shifting resistors is connected between said common connecting terminal and said power supply line so as to form said common collector load having a resistance value higher than said standard resistance value.

16. An ECL gate array as set forth in claim 14 further comprising a power supply pad connected to said power supply line, and said second group of basic cells comprising a basic cell arranged farther from said power supply pad than a basic cell in said first group.

17. An ECL gate array as set forth in claim 14, wherein said second group of basic cells comprises an improved basic cell having another output transistor connected in parallel to said output transistor, said another output transistor operatively functioning to improve the rising speed of the output voltage at said output end.

18. An ECL gate array as set forth in claim 15, wherein each of said basic cells has an output resistor connected between the emitter of said output transistor and an another power supply line, and said third group of basic cells comprising an improved basic cell, said improved basic cell having another output resistor connected in parallel to said output resistor, said another output transistor operatively functioning to improve the falling speed of the output voltage at said output end.

* * * * *